(12) United States Patent
Mazzola et al.

(10) Patent No.: US 10,872,845 B2
(45) Date of Patent: Dec. 22, 2020

(54) PROCESS FOR MANUFACTURING A FLIP CHIP SEMICONDUCTOR PACKAGE AND A CORRESPONDING FLIP CHIP PACKAGE

(71) Applicant: STMICROELECTRONICS S.R.L., Agrate Brianza (IT)

(72) Inventors: Mauro Mazzola, Calvenzano (IT); Matteo De Santa, Mezzago (IT); Battista Vitali, Romano di Lombardia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/007,767

(22) Filed: Jun. 13, 2018

(65) Prior Publication Data

US 2018/0374780 A1 Dec. 27, 2018

(30) Foreign Application Priority Data

Jun. 27, 2017 (IT) .......................... 102017000071775

(51) Int. Cl.
*H01L 23/495* (2006.01)
*H01L 23/31* (2006.01)
(Continued)

(52) U.S. Cl.
CPC ...... *H01L 23/4951* (2013.01); *H01L 21/4825* (2013.01); *H01L 21/4828* (2013.01); *H01L 21/565* (2013.01); *H01L 23/3107* (2013.01); *H01L 23/3114* (2013.01); *H01L 23/4334* (2013.01); *H01L 23/49548* (2013.01); *H01L 23/49582* (2013.01); *H01L 24/16* (2013.01); *H01L 24/81* (2013.01); *H01L 21/561* (2013.01); *H01L 23/3157* (2013.01); *H01L 24/13* (2013.01); *H01L 24/97* (2013.01); *H01L 2224/1134* (2013.01); *H01L 2224/13021* (2013.01); *H01L 2224/13023* (2013.01); *H01L 2224/13139* (2013.01); *H01L 2224/13144* (2013.01);
(Continued)

(58) Field of Classification Search
None
See application file for complete search history.

(56) References Cited

U.S. PATENT DOCUMENTS 8,952,529 B2 * 2/2015 Lee ..................... H01L 23/3128
257/737
9,911,708 B2 * 3/2018 Arvin ..................... H01L 24/16
(Continued)

*Primary Examiner* — Ali Naraghi
(74) *Attorney, Agent, or Firm* — Seed Intellectual Property Law Group LLP

(57) ABSTRACT

A process for manufacturing a semiconductor flip chip package and a corresponding flip chip package. The process comprises associating conducting bump pads to a face corresponding to an active side of one or more electronic dice, flipping the one or more electronic dice so that said face corresponding to an active side of one or more electronic dies is facing a leadframe carrying contacting pads in correspondence of said conducting bump pads, bonding said contacting pads to said conducting bump pads and encasing said one or more electronic dice in a casing by a molding operation. The process includes providing a leadframe having contacting pads presenting a recessed surface in correspondence of the position of said conducting bump pads.

14 Claims, 3 Drawing Sheets

(51) Int. Cl.
*H01L 21/56* (2006.01)
*H01L 21/48* (2006.01)
*H01L 23/00* (2006.01)
*H01L 23/433* (2006.01)

(52) U.S. Cl.
CPC ............ *H01L 2224/13147* (2013.01); *H01L 2224/16112* (2013.01); *H01L 2224/16257* (2013.01); *H01L 2224/814* (2013.01); *H01L 2224/8185* (2013.01); *H01L 2224/81191* (2013.01); *H01L 2224/81385* (2013.01); *H01L 2224/81801* (2013.01); *H01L 2224/94* (2013.01); *H01L 2224/97* (2013.01)

(56) References Cited

U.S. PATENT DOCUMENTS

| | | | |
|---|---|---|---|
| 2003/0189261 A1* | 10/2003 | Tong | H01L 24/05 257/780 |
| 2007/0099348 A1 | 5/2007 | Sharma et al. | |
| 2011/0285013 A1* | 11/2011 | Chuang | H01L 24/13 257/737 |
| 2012/0126429 A1* | 5/2012 | Do | H01L 24/14 257/777 |
| 2016/0086902 A1* | 3/2016 | Lu | H01L 24/14 257/737 |
| 2016/0372430 A1* | 12/2016 | Arvin | H01L 24/81 |
| 2017/0170101 A1 | 6/2017 | Arguelles et al. | |

* cited by examiner

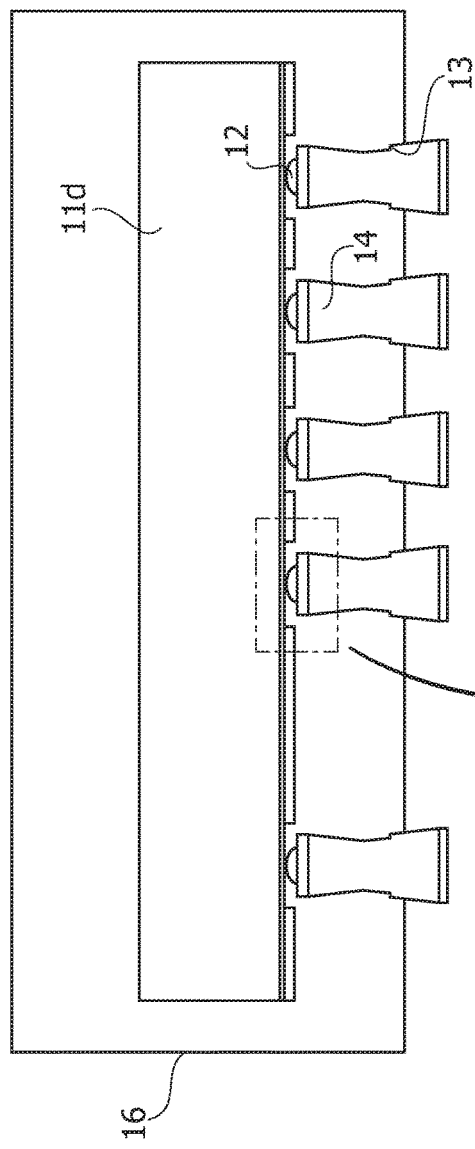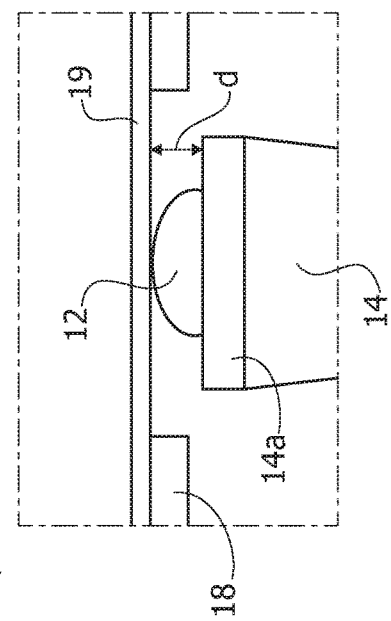

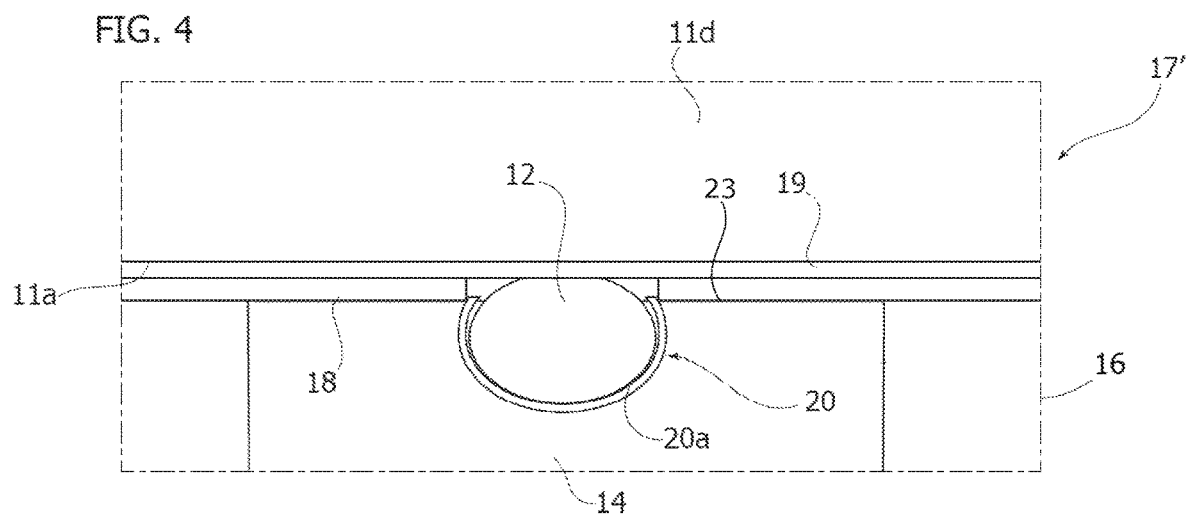
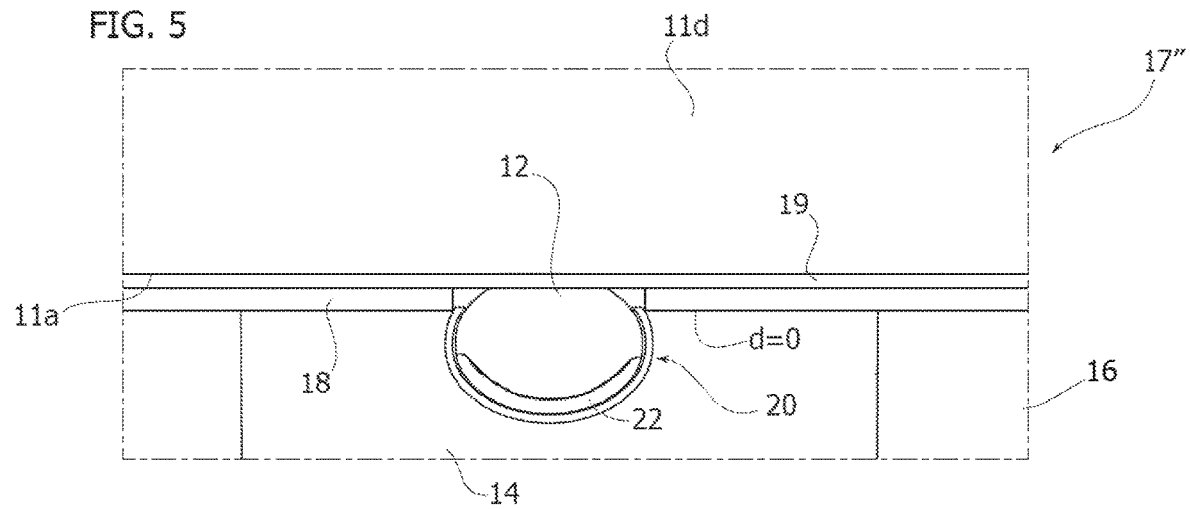

PROCESS FOR MANUFACTURING A FLIP CHIP SEMICONDUCTOR PACKAGE AND A CORRESPONDING FLIP CHIP PACKAGE

BACKGROUND

Technical Field

The description relates to techniques for manufacturing a semiconductor flip chip package.

Description of the Related Art

The standard method of connecting a semiconductor die or chip to a substrate uses conventional wire-bonding technology. The semiconductor die or chip has an active surface that includes one or more integrated circuits. The die is glued, or otherwise fixed, to the substrate in many cases with the active surface facing up and away from the substrate. Perimeter gold wire is then typically used to connect the die to the substrate.

An alternative to the standard interconnect method is flip chip technology. With a flip chip the die is turned over ("flipped") so that the circuit, i.e., the active surface of the chip or die, faces the substrate. Circuit connections can be accessed directly on the active surface of the die and do not need to be routed to the perimeter of the die. The classic method of interconnecting the die to the substrate using flip chip technology is with conductive bumps, in particular solder bumps. Other methods include tape-automated bonding, wire interconnects, isotropic and anisotropic conductive adhesives, metal bumps, compliant bumps, and pressure contacts.

In FIG. 1 is described a flow of steps of a known process for manufacturing a semiconductor flip chip package, the process being indicated as a whole by the numerical reference 100.

In a step 110 a wafer 11 is shown, for instance a crystal silicon wafer for semiconductor devices, which has an upper surface 11a and lower surface 11b. On the wafer 11 are defined one or more dice 11d having active surfaces on which respective one or more integrated circuits are formed. Typically, the semiconductor dice are produced in large batches on a single wafer of electronic-grade silicon (EGS) or, in variant embodiments, other semiconductor (such as GaAs) through semiconductor processes, including photolithography, deposition, and etch. The wafer is then cut or "diced" into many dice, each containing one or more of the circuits.

The wafer 11 in step 110 is subjected to an operation of stud bumping through which conductive bumps, or bumps, 12 are applied to the active surface or upper surface 11a as shown in FIG. 1. The bumps 12 may be, for instance gold bumps, applied by a suitable wire bonder. In variant embodiments the bumps 12 may be copper or silver.

With reference to step 120, the wafer is diced, such as in a sawing operation, which is also a known standard process. In the dicing step, the wafer is separated into a plurality of dice 11d. A support 31, also called sticky foil, is shown, and is applied to the lower surface 11b of the wafer 11 to support the wafer 11d during the dicing step and after dicing, the dice 11d. The support includes a metal flat frame and an adhesive layer, such as tape.

Then in step 130, a leadframe 13, which may be a leadframe strip or array, is provided on which the dice 11d are to be attached. The leadframe 13, which in variant embodiments may be a top etched leadframe, includes on an its upper surface a plurality of contacting pads 14 (or leads) presenting on their top surface a pad top finishing layer 14a, which is a metal layer obtained by plating. The leadframe 13 includes also plated contacts 15 (or leads) on the lower surface of the leadframe 13, obtained by plating, at positions on the leadframe 13 axially corresponding to the position of the pads 14. The leadframe 13 is provided without a tape on the lower or bottom surface. The leadframe 13 standard material is copper alloy, pads 14 are obtained on the leadframe 13 by etching technology. As mentioned, contacting pads 14 are plated with precious metals, such as gold or silver, to obtain the pad top finishing layer 14a which ensure a proper electric connection with the bumps 12. In variant embodiments, the shape and design of the pads 14 can be customized.

Then in step 140 the sawed dice 11d are flipped so that the active surface 11a of the dice 11d faces the upper surface of the leadframe 13, in particular each bump 12 faces the pad top finishing layer 14a of a respective pad 14. Then a soldering step is performed, preferably a thermosonic flip chip bonding step, to attach the pads 14 to the bumps 12, i.e., to attach the dies 11d to the leadframe 13. This may be a clean step, with no reflow or cleaning or curing step being required.

In step 150, a molding operation is performed, for instance by transfer molding or compression molding, encasing portions of the leadframe 13 and the dice 11d in a resin casing 16. This also may be performed by a standard mold system and standard molding compound (small filler size) and without underfiling.

Then step 160 a back etching step of the leadframe 13 is performed to separate the plated contacts 15. In the back etching step, the copper from the leadframe 13 is removed that joins together such plated contacts 15.

Finally in step 170, a package dicing operation is performed to separate the package 17 from other packages. Each package 17 includes a die 11d with a respective portion of the casing 16 and the respective portion of leadframe 13 and contacts 15.

Before the sawing step 170, in variant embodiments, a strip testing operation may be performed. The capability of performing the strip test in strip form originates from the fact that contacts 15 are isolated connections to the dice 11d. The sawing operation does not cut through the copper of leadframe 13, just cut through the mold compound of the casing 16.

Therefore as shown in FIG. 1, stud bumps are properly made on the die using a thermosonic process with wire bonder equipment, this process is done directly at wafer level.

After associating the stud bump to the wafers, wafers are sawn with a standard sawing equipment, so that the dice are ready to be flipped on a leadframe. Stud bumps need to match the pads of the leadframe. Bumps are welded by the action of ultrasonic energy and heat, also called thermosonic flip-chip bonding.

In FIG. 2 a cross-section of a semiconductor package 17 is shown, where the die 11d is encased in the mold compound 16 and there are a plurality leads of leadframe 13, which are connected to the pads 14, which in turn have bumps 12 formed thereon.

With reference to area 50, there is a magnified and in more detail view of a portion of FIG. 2, which is shown in FIG. 3.

In reference to FIG. 3 the area 50 is a detail of a bump 12 bonded to a pad 14 at the end of the process 100. At this point the bumps 12 connect the pads 14 with bond pads 19 of the die 11d. Bumps 12 appear to be squashed and their shape changes during the process 100, so that also the bumps 12 height is reduced. In FIG. 3 it can be observed that the wafer 11 is covered by an insulation layer 18 which is in particular a photosensitive insulation layer. The photosensitive insulator materials may be polybenzobisoxazole (PBO) or polyimide materials. The bond pads 19 of die are located on the active surface of the die.

A gap d, i.e., a height in the vertical direction, between the photosensitive insulation layer 18 and the top finishing layer 14a of a pad 14 is defined by such process 100.

The aperture of gap d is very small and typically is filled by resin at the molding step 150 in order to be used in some applications. This is critical for resin flow filling. Standard resin fillers granulometry, could be bigger than the gap dimension. To overcome this problem, in order to properly fill the whole package with the mold compound, the resin fillers have to be very small and well controlled.

The cost of this kind of resin with small fillers is high and, in case of voids during the molding step, also the reliability performances are impacted.

BRIEF SUMMARY

One or more embodiments may also relate to a semiconductor package and a process of making same. In one embodiment, the process comprises associating conducting bump pads to a face corresponding to an active surface of at least one semiconductor die, flipping the die so that the active surfaces of the die faces a leadframe carrying contacting pads in correspondence of said conducting bump pads, bonding said contacting pads to said conducting bump pads, and encapsulating the die in a package body in a molding operation.

One or more embodiments may apply, e.g., to cost reduction in integrated circuits, e.g., for smartcard products.

The claims are an integral part of the technical disclosure of one or more embodiments has provided herein.

One or more embodiments may lead to cost reduction by determining that there is no longer a gap between a contacting pads of the leadframe and the photosensitive insulation layer of the semiconductor die to be full filled during the molding operation, such as by molding compound.

One or more embodiments may involve a modification of the flip chip process, including providing a leadframe having contacting pads presenting a recessed surface in correspondence of the position of said conducting bump pads.

BRIEF DESCRIPTION OF THE SEVERAL VIEWS OF THE DRAWINGS

One or more embodiments will now be described, purely by way of example, with reference to the annexed figures, in which:

FIG. 2 shows a cross section view of one of the packages of FIG. 1, while FIG. 3 is a close up view of a portion of the package of FIG. 2, FIG. 4 is close up view of a semiconductor package in accordance with one embodiment; and FIG. 5 is close up view of a semiconductor package in accordance with a further embodiment.

Figure 1:
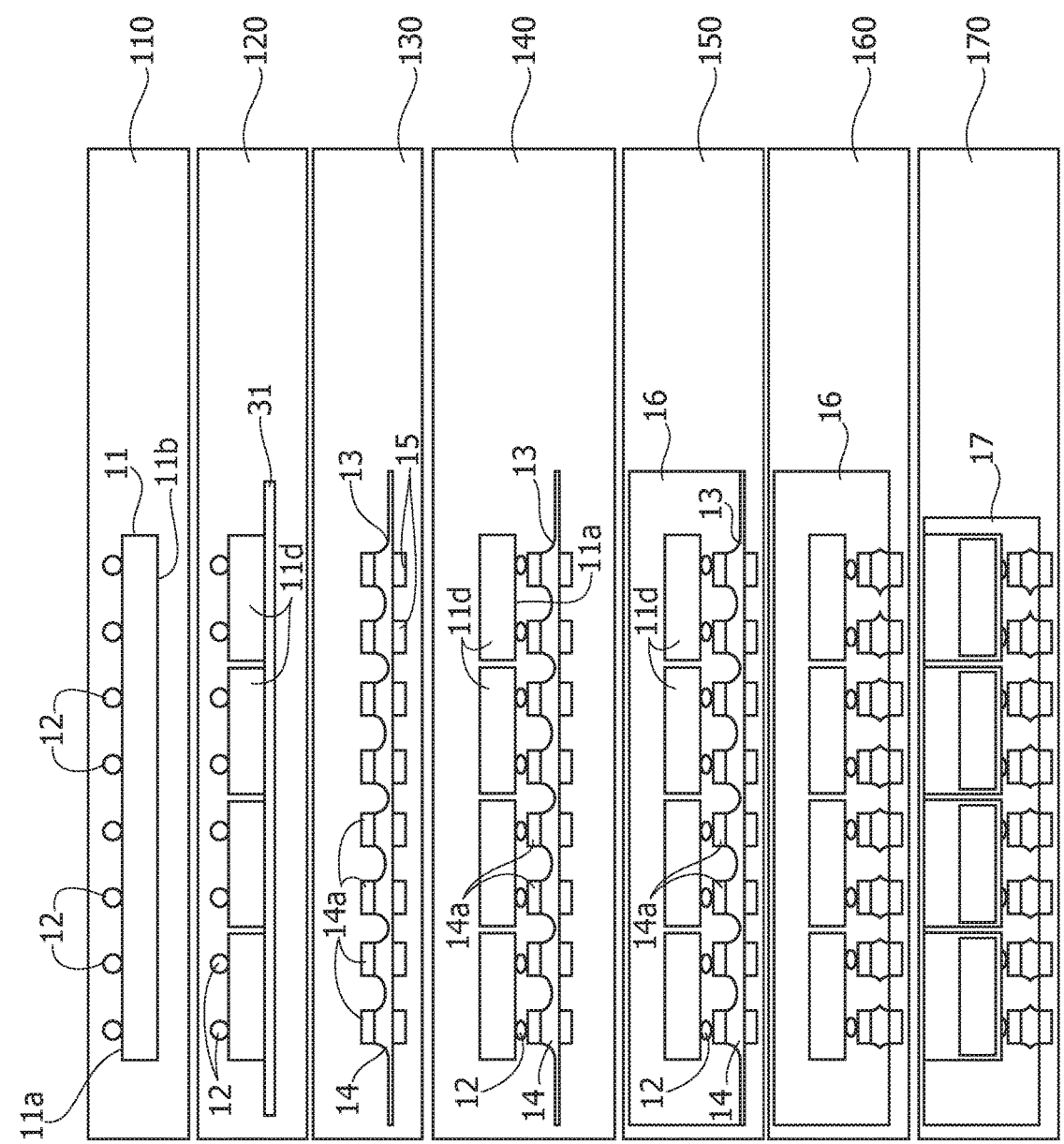
FIG. 1 shows cross section views of various stages of manufacturing semiconductor packages in accordance with known procedures.

It will be appreciated that for the sake of clarity of representation certain features of the figures (e.g., layer thicknesses) may not be drawn to a same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In FIG. 4 it is shown a flip chip packaged integrated circuit 17' according to an embodiment of the solution here described. The view shown in FIG. 4 corresponds to that of area 50 in FIG. 3. The portions not shown are the same as the portions shown and described in FIG. 3. Elements having the same reference numbers have the same structure and function, except for any differences described below.

According to the solution here described, the integrated circuit flip chip package 17' includes leads or pads 14 presenting a top surface 23 without top finishing layer 14a as discussed above in reference to FIGS. 1-3. Instead the top surface 23 of the pad 14 includes a recessed area ("dumped area") 20, which is a depression at the top surface 23 of the pad 14 forming a recessed surface, i.e., a down-set surface, with respect to the top surface 23. As shown in FIG. 4 such a recessed surface has substantially a semicircular cross section; however, recessed surface may have other shapes as well.

The recessed area 20 is, in the embodiment of FIG. 4, plated with a plating layer 20a, for instance a gold or a silver plating layer, in order to enable a good electrical contact between the bump 12 and the pad 14 during the flip-chip process. In view of the top surface 23 not being plated, the total area to be plated on the leadframe 13 is substantially reduced, since there is no pad top finishing layer 14a, only the smaller plating layer 20a in the recessed area 20. The stud bump 12 is positioned inside the recessed area 20 and coupled to the pad 14. Although the recessed area 20 is shown as being similar in size and shape to the stud bump 12, in other embodiments, the recessed area 20 is larger than the stud bump 12 for alignment purposes and/or so that as the stud bump couples to the pad 14 in the recessed area 20, the stud bump has room to flow within the recessed area 20.

In view of the above, the gap between the photosensitive insulation layer 18 and the top surface 23 of the pad 14 of the leadframe 13 may be eliminated, so there is no need to fill with mold compound a gap.

Preferably, the die 11d is covered with the photosensitive insulation layer 18, such protective film protecting and electrically insulating the active side surface 11a of the die 13. The photosensitive insulation layer 18 is on portions of the bond pads 19 and includes a window or opening at locations where the stud bumps 12 are placed and minimizes the amount of bond pad area that is exposed. Thus, the top surface 23 of the pad 14 is larger than the opening in the photosensitive insulation layer 18 and abuts the photosensitive insulation layer 18. Furthermore, pressure may be applied when coupling the stud bump 12 to the plating layer 20a in the recessed area to cause the top surface 23 of the pad 14 to abut the photosensitive insulation layer 18.

The wafer 11 is provided for the process already with the insulation layer 18. The insulation layer 18 (or a passivation layer) is removed from the area where the bump 12 is to be applied, prior to step 110, creating a window in the layer 18 in the bonding zone.

The recessed area 20 in the pad 14 can be obtained by an etching technique, wet or dry, masking the top of the pad 14 where it is not to be etched, or it can be obtained by a mechanical working, like removing material by a tool or coining, or laser ablation.

In FIG. 5 is shown an alternative embodiment of a integrated circuit flip chip package 17", where the recessed area 20 is partially filled with a filler material 22. Such filler material 22 may be solder, or in variant embodiments, the filler material 22 may be glue or TLP (Transition Liquid Phase) material. The filler material 22 has to be able to perform a retaining action on the bump 12 immersed in the recessed area 20. The amount filler material 22 in the recessed area 20 has preferably to fill a volume which is less than the internal volume of the dumped area, this volume or amount being such to avoid any spillage outside the dumped areas 20. It will be otherwise appreciated that the specific choices of material as exemplified in the foregoing are primarily related to certain process embodiments, e.g., in connections with the flip chip package manufacturing process flow. In one or more embodiments, different implementation options may dictate, e.g., different choices of materials and/or layer thicknesses.

Thus, summarizing the above, one or more embodiments may provide a process for manufacturing an integrated circuit flip chip package, said process comprising associating 110 conducting bump pads 12 to a face 11a corresponding to an active side of one or more electronic dice 11d,
flipping the one or more electronic dice 120 so that said face 11a corresponding to an active side of one or more electronic dice 11d is facing a leadframe 13 carrying contacting pads 14 in correspondence of said conducting bump pads 12,
bonding 130 said contacting pads 14 to said conducting bump pads 12 and
encasing said one or more electronic dice 11d in a casing 16 by a molding operation 150,
characterized in that includes providing a leadframe 13 having contacting pads 14 presenting a recessed surface 20 in correspondence of the position of said conducting bump pads 12.

Then, in variant embodiments the process may include plating said recessed surface 20 to obtain a plated electrical contact 20a in correspondence of the position of said bumps 12.

Then, in variant embodiments the process may include filling said recessed surface with a filler material, in particular solder or glue or TLP material, able to perform a retaining action on the bump 12.

In some embodiments, the process may include applying pressure to said one or more electronic dices 11d and contacting pads 14 together to prevent a gap therebetween.

One or more embodiments may thus provide a process including providing a leadframe 13 having pads presenting a recessed surface 20 in correspondence of the position of said bumps 12 includes obtaining said recessed surface 20 by one of the following processes:
Wet or dry etching;
Mechanical working, in particular coining;
Laser ablation.

Then, in variant embodiments the process may include using dice 11d which face 11a corresponding to an active side of one or more electronic dice 11d is covered by a photosensitive insulation layer 18.

One or more embodiments may also provide an integrated circuit flip chip package comprising at least a die on a leadframe associated to said leadframe 13 by conducting bump pads 12 on a face 11a corresponding to an active side of said at least a die 11d, matching contacting pads 14 on said leadframe 13 and bonded to said contacting pads 14, said at least a die 11d being encased in a molded casing 16, said leadframe 13 having contacting pads 14 presenting a recessed surface 20 in which a respective bump pads 12 is bonded.

One or more embodiments may also provide an integrated circuit flip chip package manufactured according to the process described in the preceding paragraphs.

The solution described determines that in the process there are no more gap to be full filled by molding compound.

Also there is less mechanical stress during molding process.

Another aspect is that resin with standard filler may be used instead of special small or ultrasmall filler size.

Plating the recess area on the pad involves a reduced top finishing area and cost Filling the recess area with a filler material retaining the bump determines that the flip chip process may be performed at ambient temperature (no more thermosonic energy needed). Also filler materials such as solder/glue/TLP materials can help to absorb mechanical stress during thermal cycles A further aspect of the solution described is that reduces overall package thickness and also the cantilever effect on die can be reduced due to the zero gap between die and leadframe. Indeed, during the molding step, the resin with the solution described does not push the die from the bottom to the top.

Without prejudice to the underlying principles, the details and embodiments may vary, even significantly, with respect to what has been disclosed merely by way of example, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An integrated circuit flip chip package, comprising:
a semiconductor die including a surface formed by an insulative layer and bond pads;

a plurality of leads having first surfaces facing the bond pads, respectively, the first surfaces of the plurality of leads having recesses, respectively; and conductive bumps located in the recesses of the plurality of pads and coupling the bond pads to the plurality of leads, respectively, wherein the first surfaces of the plurality of leads abut the insulative layer at the surface of the semiconductor die.

2. The integrated circuit flip chip package according to claim 1, further comprising conductive filler material in the recesses that aid in coupling the conductive bumps to the plurality of leads.

3. The integrated circuit flip chip package according to claim 1 wherein the recesses of the plurality of leads include finishing layers, respectively.

4. The integrated circuit flip chip package according to claim 3 wherein the finishing layer is gold, gold alloy, silver, or silver alloy.

5. The integrated circuit flip chip package according to claim 1 wherein the semiconductor die includes an insulation layer, the insulation layer including openings that expose the bond pads, wherein the first surfaces of the leads are larger than the openings in the insulation layer.

6. A semiconductor package, comprising:
a semiconductor die including an active surface that includes a bond pad and an insulation layer, the insulation layer including an opening that exposes the bond pad;
a lead having a surface facing the active surface of the semiconductor die, the lead having a recess at the surface, a finishing layer located in the recess; and
a conductive bump located in the recess of the lead and between the bond pad and the finishing layer, wherein the conductive bump electrically couples the bond pad to the lead, wherein the surface of the lead overlaps with the insulation layer beyond the opening at the active surface.

7. The semiconductor package according to claim 6, further comprising a conductive filler material in the recess coupled to the conductive bump.

8. The semiconductor package according to claim 7 wherein the filler material is solder or glue.

9. The semiconductor package according to claim 6, wherein the recess includes a solder material that aids in coupling the conductive bump to the lead.

10. The semiconductor package according to claim 9, wherein the finishing layer is one of gold, gold alloy, silver, or silver alloy.

11. The semiconductor package according to claim 6, wherein the surface of the lead abuts the insulation layer.

12. A semiconductor package, comprising:
a semiconductor die including an active surface, wherein active surface of the semiconductor die includes a bond pad and passivation material, wherein the passivation material is around a perimeter of the bond pad such that a central portion of the bond is exposed from the passivation material;
a lead having a surface that is larger than the central portion of the bond pad, the surface of the lead including a recess at the surface, wherein a finishing layer is located in the recess; and
a conductive bump located in the recess of the lead and between the bond pad and the finishing layer, wherein the conductive bump electrically couples the bond pad to the lead,
wherein the surface of the lead overlaps and abuts the passivation material at the active surface and outwardly of the conductive bump.

13. The semiconductor package according to claim 12, wherein the recess includes a solder material that aids in coupling the conductive bump to the lead.

14. The semiconductor package according to claim 12, wherein the recess has a width that is less than a width of the central portion of the bond pad.

* * * * *